United States Patent [19]
Greaves

[11] Patent Number: 5,941,997
[45] Date of Patent: Aug. 24, 1999

[54] CURRENT-BASED CONTENTION DETECTION AND HANDLING SYSTEM

[75] Inventor: Paul E. Greaves, Granite Bay, Calif.

[73] Assignee: Play Incorporated, Rancho Cordova, Calif.

[21] Appl. No.: 08/833,847

[22] Filed: Apr. 10, 1997

Related U.S. Application Data

[63] Continuation-in-part of application No. 08/757,747, Nov. 26, 1996.

[51] Int. Cl.[6] .................................................... G06F 11/00
[52] U.S. Cl. ............................................................ 714/48
[58] Field of Search ........................ 395/185.01, 184.01, 395/182.13; 364/152, 184; 714/48, 47, 15; 340/511, 635, 653, 661, 664; 371/28, 57.2

[56] References Cited

U.S. PATENT DOCUMENTS

| | | | |
|---|---|---|---|
| 4,255,748 | 3/1981 | Bartlett | 340/661 |
| 4,298,982 | 11/1981 | Auerbach | 371/30 |
| 4,667,191 | 5/1987 | Comroe et al. | 340/825.5 |
| 4,941,126 | 7/1990 | Haubursin | 364/900 |
| 5,247,207 | 9/1993 | Wert et al. | 307/270 |
| 5,596,716 | 1/1997 | Byers et al. | 395/185.01 |
| 5,742,753 | 4/1998 | Nordsieck et al. | 395/182.09 |
| 5,805,817 | 3/1996 | Yu et al. | 395/200.54 |
| 5,867,645 | 2/1999 | Olarig | 395/185.01 |

*Primary Examiner*—Robert W. Beausoliel, Jr.
*Assistant Examiner*—Stephen C. Elmore
*Attorney, Agent, or Firm*—Carr & Ferrell LLP

[57] ABSTRACT

A current-based contention detection and handling system, upon detection of excessive current being applied to a communicating subsystem, avoids potential system damage by preventing continued excessive current. In a preferred embodiment, a current sensor and a subsystem control unit are provided in each communicating subsystem. The subsystem control unit preferably includes a latch and control logic. A system coordinator is further preferably provided for directing recovery. Upon current sensor detection of excessive current to a subsystem bus driver, the subsystem control unit disables the bus driver and asserts an interrupt and fault line to alert the system coordinator. The system coordinator confirms the alert and, upon confirmation, a preferably resets both the subsystem and the subsystem control unit. The subsystem control unit preferably includes a latch and control logic.

24 Claims, 8 Drawing Sheets

CURRENT-BASED CONTENTION DETECTION AND HANDLING SYSTEM

CROSS-REFERENCE TO RELATED APPLICATION

This application is a Continuation-In-Part claiming priority of co-pending U.S. patent application Ser. No. 08/757,747, entitled "Real-Time Video Processing System," filed on Nov. 26, 1996, which subject matter is hereby incorporated by reference.

BACKGROUND OF THE INVENTION

1. Field of the Invention

This invention relates to subsystems communications and more particularly to a bus contention control system that detects and responds to excessive bus current most often resulting from attempts by communicating subsystems to contemporaneously drive the same communications bus-lines.

2. Discussion of the Prior Art

Computers and other systems in which information is electrically communicated among primary system elements ("subsystems") typically utilize busses for such communication. Each bus is typically divided into functional sub-groupings ("sub-busses") and each sub-bus further comprises a number of electrical connections ("bus-lines") which directly or indirectly connect two or more subsystems.

Various interconnection configurations ("topologies") for connecting multiple subsystems using one or more serial and/or parallel busses are well known in the art, as are the use of separate ("non-multiplexed") or shared ("multiplexed") address and data bus-lines. For purposes of illustration, the term "bus" will refer to a parallel, multiplexed or non-multiplexed bus in which subsystems connect to designated bus-lines of a continuous linear trunk, commonly referred to as a linear bus topology model.

FIG. 1 shows, for example, a bus ("PC bus") 101 as it is commonly used in a conventional personal computer ("PC") 100. Connected to PC bus 101 in a typical configuration are processor 120, memory 130, host video I/O controller 140, host audio I/O controller 150, user-I/O controller (for connecting user interface control devices such as a keyboard and/or mouse) and system expansion interface 170. PC bus 101 provides a common communications pathway for transfer of commands and data among all connected subsystems. While deviations exist, such as the monitor 145 connection to host video I/O controller 140, the predominant model remains that of a linear bus. Similarly, the host video I/O controller 140 and monitor 145 pair and other subsystems might be connected to system expansion interface 170 forming a secondary linear bus without need to redefine the predominant linear bus model.

Communicating subsystems communicate over a bus by setting the signal level of designated bus lines to appropriate states at predetermined times according to a predetermined procedure or "protocol." For example, subsystems communicate over a digital bus by setting the voltage of, or "driving", selected bus-lines to a higher or lower level (according to the regular pulses of a clock) using one or more integral subsystem bus drivers. Typically, an originating subsystem ("sender") initiates a message for receipt by an intended receiving subsystem ("receiver"). Since all present and activated subsystems on the bus will receive all bus communications, each subsystem is assigned a unique designation ("address") and each communication is preceded by the intended receiver's address. Upon receipt, each receiver compares the intended receiver's address against its own. A receiver with a matching address further considers the communication, responds, sends data and/or receives data according to the protocol utilized and the contents of the communication received.

Conventional bus structures, as described thus far, are well matched to the needs of conventional systems, such as personal computers ("PCs"). The Personal Computer Interface ("PCI") bus, for example, is well matched to the moderate communication rates and limited number of operationally static subsystem expansions and modifications available in conventional PCs. For example, the PCI bus, as commonly configured, provides a transfer rate of only fifty megabytes per second. While subsystem-receiving sockets ("slots") are provided for adding and exchanging add-on subsystems ("expansion cards"), only three such slots are typically provided. In addition, expansion cards provide wholly predictable interaction with the bus and other system components. Expansion cards are assigned an address upon installation and their functionality, their communications pattern and their respective addresses remain essentially unchanged during operation.

The discussed bus structure is also often well matched to a more complex system requiring faster communication and utilizing dynamic subsystem address and bus assignment among a larger number of dynamically reconfigurable subsystems. Unfortunately, such a bus structure does not envision the potentially catastrophic results that might occur in such a complex system if more than one subsystem attempts to utilize the same bus contemporaneously. Such conflicting attempts to utilize a bus are commonly referred to as "bus contention" or simply "contention."

Contention is not a critical concern in PCs and other less complex systems providing only moderate speed communications. One reason is that the possibility of contention is extremely remote in such a "well-behaved" system. Only a small number of statically addressed subsystems must compete for available communications lines and only a moderate communication rate is utilized, thus decreasing the probability that error will occur. In addition, such systems are not required to perform responsively enough to be considered real-time and, as a result, bus allocation according to a simpler predetermined priority-level based, "first-come first-serve" method can be imposed with little concern for time-intensive subsystem communications that might monopolize bus usage. Sufficient controls can therefore more readily be applied to prevent nonparticipating subsystems from interfering with ongoing communications. Thus, the potential causes of contention are nearly non-existent.

A second reason is that, even if contention should occur, the results of contention in such less complex systems, while undesirable, are not catastrophic. In such a case, only an unfortunate corruption of data (due to conflicting information being placed on a bus at the same time) might occur. Since data corruption can also occur for any number of other reasons, such as line noise, methods are well known for detecting and correcting corrupted data transmissions. In addition, the extended time required for such detection and correction, which typically amounts to checking received data and requesting re-transmission, is of little consequence in a non-real-time system. Thus, neither a rare occurrence of contention nor conventional time-intensive corrective measures pose an immediate threat to overall system integrity in PCs or other such less complex and well-behaved systems.

Unfortunately, more complex systems with higher communication rates are more prone to contention and other errors, so conventional time-intensive prevention and corrective measures cannot be readily employed, particularly in real-time systems. To make matters worse, such errors might well produce catastrophic results. Faster communication over a bus requires faster switching, which, due to lower bus impedance, requires bus drivers capable of delivering greater current. Should contention occur, it is likely that, at some point, one contending subsystem will attempt to drive one or more bus-lines low while another attempts to drive the same bus-lines high. In such a case, the subsystem attempting to drive the bus-lines high has a sufficient source of current available that the subsystem will deliver ever-increasing amounts of current to the bus-lines in its effort to drive the bus-lines high. Likewise, the subsystem attempting to drive the bus-lines low will continue to sink the ever-increasing bus-line current, potentially resulting in both cases in dangerous current levels. Thus while occurrences of contention are rare, detection and corrective actions should be provided and such actions should be quickly and reliably implemented. Conventional time-intensive data corruption tests and potential re-transmission are therefore wholly inadequate, particularly among faulty systems that produced the error utilizing the communication path that has already been put at risk.

Thus, there is a need for a means for quickly detecting, responding to, and avoiding a continuing occurrence of bus contention.

SUMMARY OF THE INVENTION

The present invention provides a support system for quickly detecting and responding to occurrences where communicating subsystems are attempting to contemporaneously drive the same bus lines, resulting in excessive current.

Accordingly, the present invention comprises a subsystem bus interface that determines whether excessive current is being supplied to one or more bus-lines and if so, provides for reporting and correction. In a preferred embodiment, each communicating subsystem comprises a current sensor responsive to current in excess of a predetermined maximum current properly deliverable to a bus. Each subsystem further comprises a control unit for disabling further excessive current and for redundantly reporting such an excessive current condition to a bus control subsystem by initiating an interrupt of the bus control subsystem and by setting a dedicated fault-reporting connection to the bus control subsystem. Additionally, a communicating subsystem will continue to set the fault reporting connection until such bus control subsystem takes corrective action, thereby removing the cause of the contention. Corrective action preferably comprises resetting the faulty subsystem(s).

Advantageously, each communicating subsystem, being most closely associated with such communication, is best equipped to detect, remove and report the dangerous condition of excessive bus current during communication. Thus, a communicating subsystem quickly and reliably detects excessive current. The subsystem in addition quickly removes the danger by disabling further excessive current. The subsystem also redundantly reports such an occurrence to a bus control subsystem for correction and avoids further danger by maintaining the disabled state and reporting until the bus control subsystem takes corrective action. Since the cause of excessive current is likely bus contention resulting from a failed bus assignment, corrective action including resetting the reporting subsystem is most likely to correct the underlying improper bus assignment problem and thereby avoid a re-occurrence.

These and other advantages and benefits of the present invention will become apparent from the drawings and specification that follow.

DETAILED DESCRIPTION OF THE PREFERRED EMBODIMENT

Figure 1:
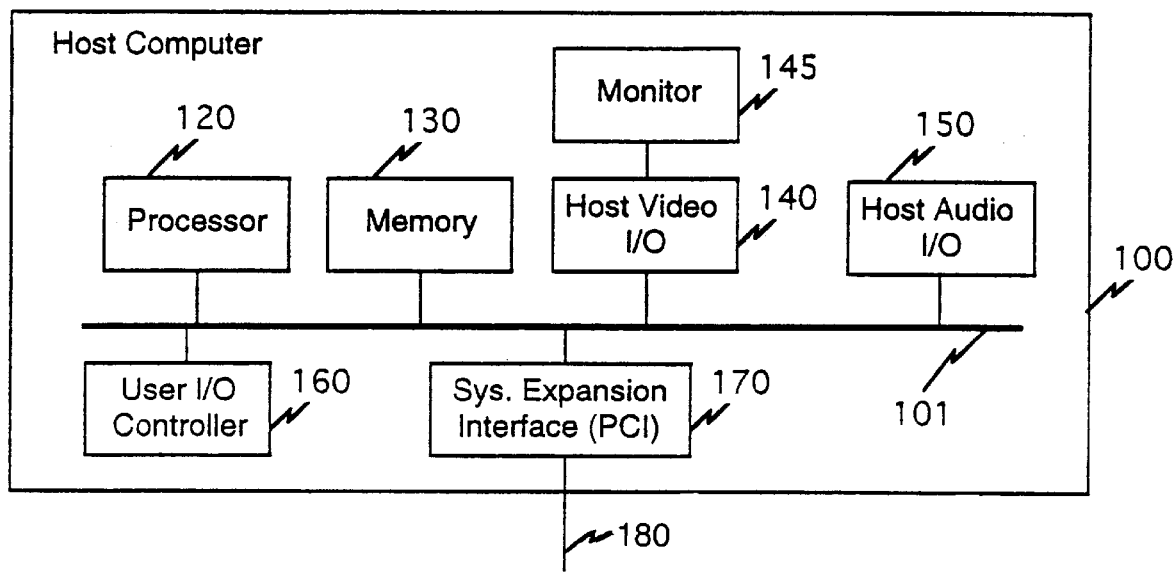
FIG. 1 is a block diagram showing the functional elements of a conventional host personal computer.
Figure 2:
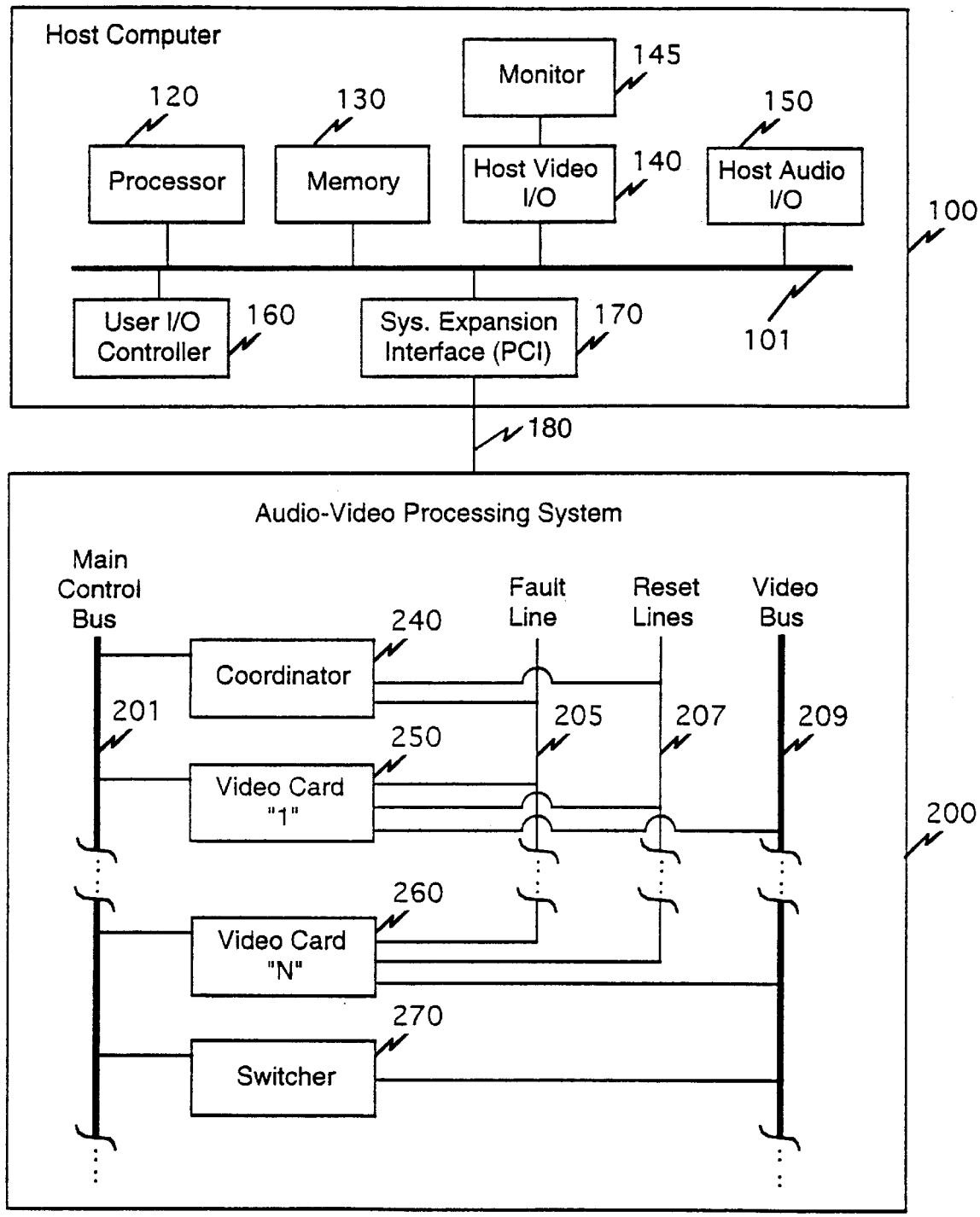
FIG. 2 is a functional block diagram showing the relevant subsystems and interconnections of a video system in accordance with the invention, including its connection to the host personal computer of FIG. 1.

The FIG. 2 functional diagram shows how the subsystem bus interface requirements of a complex system are met according to the present invention in an independently operable Audio-Video Processing System ("video system") 200 having an independent local bus system and peripheral connection to host PC 100. Video system 200 comprises subsystem elements including coordinator 240, video processing subsystem-1 250 ("video card-1") to video processing subsystem-N 260 ("video card-N"), switcher 270, and interconnection elements including main control bus 201, fault line 205, reset line 207 and video bus 209. Additionally, a peripheral communication link 180 to system expansion interface 170 of PC 100 provides use of PC-based resources for user control, downloading and audio-video previewing.

Video system 200 is a modular, re-configurable and expandable system comprising, even in a limited configuration, all elements needed for real-time mixing and/or processing of one or more audio and/or video data input streams. Video data streams supplied by external video sources are, for example, input through respective I/O Control subsystems (not shown), pre-processed to provide a consistent internally-utilized format and then communicated over video bus 209 for individual and/or combined-stream ("mixed") processing. Actual processing varies broadly from adding titles and splicing video segments to animation, video effects and virtual-world type enhancement, and is accomplished utilizing preferably up to sixteen video cards of which video card-1 250 and video card-N 260 are representative. Coordinator 240 provides for subsystem address assignment, bus utilization and other subsystem communications and system control functions utilizing main control bus 201. Switcher 270 provides for directing such video data flow utilizing video bus 209. User control and monitoring is further provided by video system 200 connection to PC 100 utilizing system expansion interface 170, which is preferably compliant with the PCI bus standard. Video system 200 also provides sophisticated audio and time-locked audio-video processing.

Video system 200 real-time performance and overall flexibility at a minimized cost are achieved in several ways. One example is that video system 200 is modular. Many subsystems, including the video cards (ie. video card-1 250, video card-N 260 and others), are socketed such that additional subsystems can be easily added and existing subsystems easily replaced according to user needs. A fully configured video system 200 preferably comprises a total of 16 socketed subsystems, such number adding powerful real time video data manipulation, but also increasing the likelihood of errors in addressing and in allocating available communication capability over main control bus 201.

Another example is that many subsystems, including video cards represented by video card-1 250 and video card-N 260, provide programmable processing capability through the use of such programmable integral elements as microprocessors and/or digital signal processors. While providing continuously maximized utilization of available subsystems despite varying functional requirements, each required functional variation utilizing the same subsystem must be communicated to the subsystem quickly enough as to not interrupt real-time audio and/or video processing. Video processing parameters and control information must also be communicated among the various subsystems quickly enough as to apparently occur in real time. Thus, high speed communication on main control bus 201 is required. Main control bus 201 communication is therefore preferably synchronized to a 20 megaHertz clock which provides a throughput of 80 megabytes per second.

A further example is that while the number of bus-lines is limited to minimize cost, each of the many subsystems may nevertheless contemporaneously require communication of functional re-configuration information and other control information from the controller, and/or processing-parameter data from other subsystems. Providing such communication with specific subsystems, each sharing main control bus 201, requires not only assigning a unique address to each subsystem. As with re-use of subsystems for varying processing functions, main control bus 201 must be re-used as it becomes available. Thus, each contemporaneous communication must be dynamically assigned for main bus 201 utilization which occurs once prior initiated or higher priority communications no longer monopolize the bus.

While maximizing the flexibility and power of a minimally configured system, accommodating the potentially contemporaneous requirements for communication among a large number of communicating systems over a shared and dynamically assigned high speed bus increases the potential for error. Of particular concern is the possibility, while rare, that two or more subsystems might attempt to communicate contemporaneously over main control bus 201 and, in such case, one subsystem might attempt to drive one or more bus-lines low while another subsystem attempts to drive the same bus-lines high.

The result of such contemporaneous and conflicting attempts to drive a bus (commonly referred to as "contention") in a video system 200 type configuration is potentially far more serious than a mere corruption of commands and/or data which is being communicated by the conflicting subsystems. While data corruption is a serious problem, particularly in a real-time system, many conditions (including noise) might be a cause, and methods exist for eventually discovering and correcting such errors, usually by re-transmitting.

More critical however, is the possibility of catastrophic error. In particular, the high speed communications over main bus 201, and the requisite high speed switching between high and low signal levels, are made possible by providing a typical available current capability of up to 10 amps or more. Therefore, during prolonged attempts by conflicting subsystems to drive a bus-line both high and low, the requisite power supply will supply ever increasing current to support the subsystem that is attempting to drive the bus-line high, resulting in heat and, even in a best-case scenario, degradation of the driver and the bus-line.

The most likely cause of contention in video system 200 is an error in assignment of subsystem designations for communication over main control bus 201. Video system 200 provides such assignment statically at reset and dynamically just prior to subsystem communication over main control bus 201. A brief overview of video system 200 subsystem designation assignment methods is therefore useful to an understanding of the invention.

Figure 3:
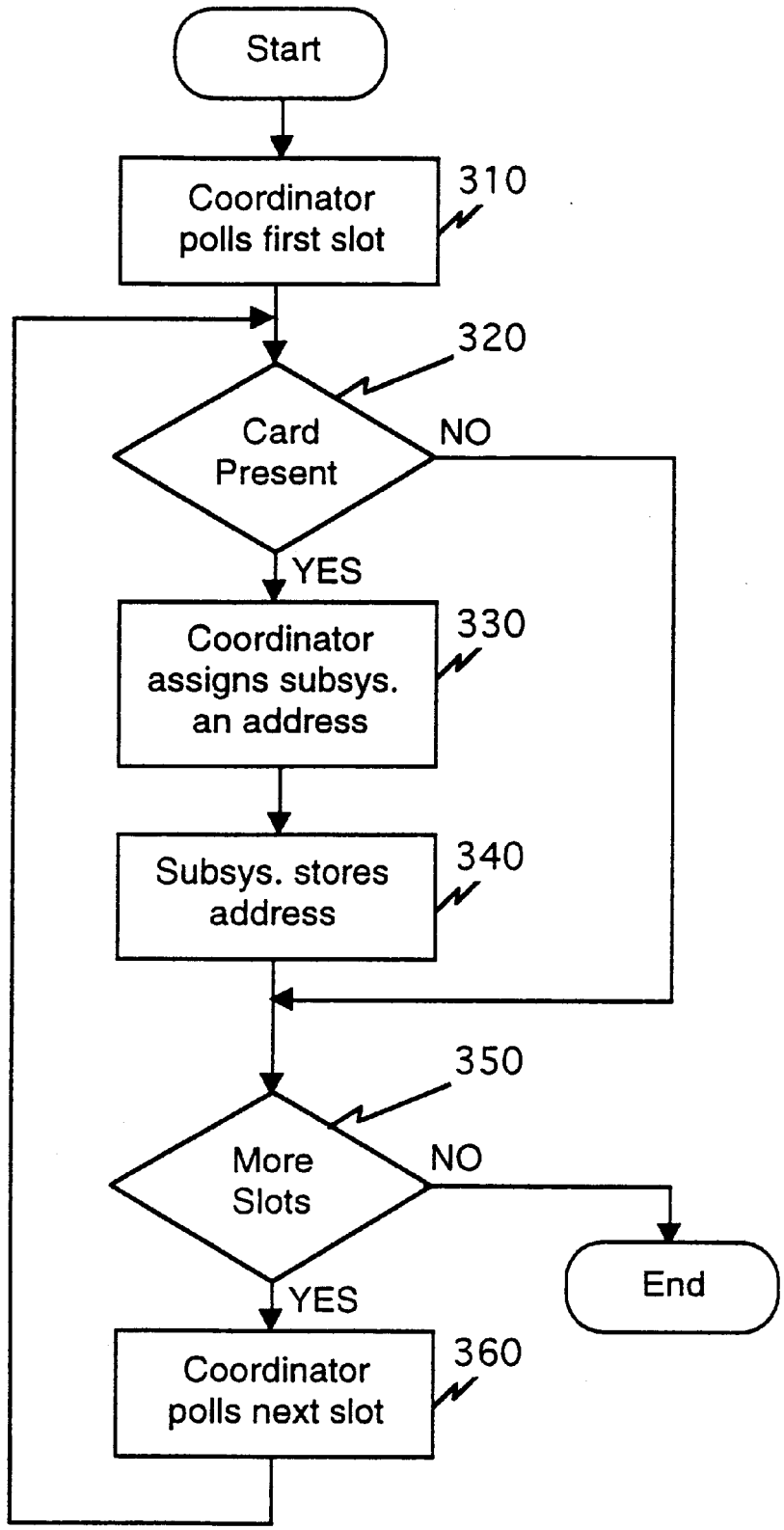
FIG. 3 is a flowchart of method steps for subsystem address assignment upon reset in accordance with the invention.
Figure 4:
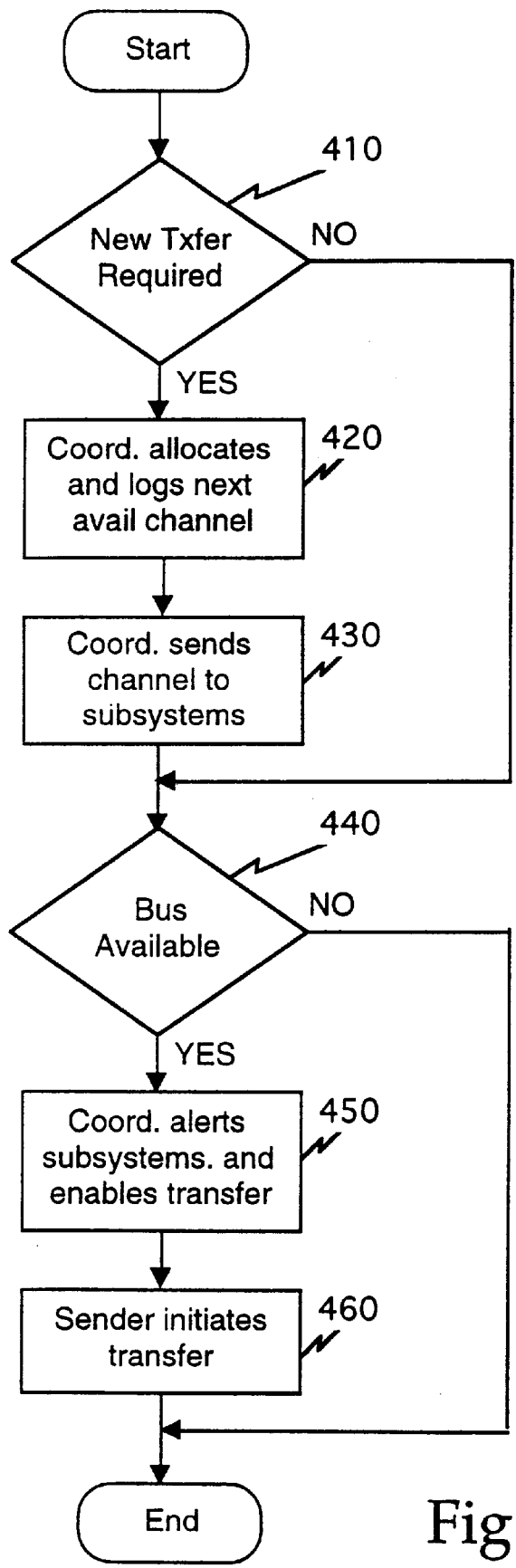
FIG. 4 is a flowchart of method steps for dynamic subsystem bus assignment in accordance with the invention.

The FIG. 3 and FIG. 4 flowcharts show how coordinator 240 (FIG. 2) utilizes main control bus 201 to effectuate static subsystem address and dynamic communications designations for subsystem utilization of main control bus 201.

The FIG. 3 flowchart illustrates how a unique address is statically assigned to each subsystem during system reset. In step 310, coordinator 240 polls a first slot for the existence of a socketed subsystem card. If, in step 320, a subsystem card is present in a first slot, then coordinator 240 initiates a transfer to the subsystem card of a first available address and, in step 340, the subsystem card stores the address in its integral memory. If instead, in step 320, a subsystem card is not present in the first slot, then no address is assigned. Whether or not a subsystem card exists in a first slot, if in step 350 more slots exist in video system 200 that have not yet been polled, then coordinator 240 polls a next slot in step 360. If instead, in step 350, no more slots remain to be polled, then all subsystem cards present have been assigned an address and address assignment is completed. Thus, controller 240 assigns each subsystem a unique address by polling each successive socket and, for each subsystem card present, sends over main control bus 201 a unique address. Addresses are preferably assigned as being sequential.

While unlikely, the possibility is heightened in a system utilizing a high speed bus that one or more subsystems will record the wrong address assignment. Since subsystem addresses are only assigned during initial reset (ie. when video system 200 is switched on), if a sufficiently severe error requires resetting of the entire system, or (preferably) in the event of contention, such address is essentially statically assigned and will be utilized by each respective subsystem communication requiring subsystem address specification. If however a subsystem has recorded a wrong address assignment, then it is possible that more than one subsystem will respond to a message directed to a given intended receiver address and contention might occur.

The FIG. 4 flowchart illustrates how coordinator 240 (FIG. 2) dynamically assigns main bus 201 utilization to requisite subsystem communications. Subsystem communication requirements, being largely determined by user requirements for video processing and the number of subsystems currently present and active, are subject to considerable variation. Such requirements may result in periods where many subsystems require contemporaneous communication and other periods where very little communication is required. Since the video system 200 design seeks to minimize cost and component complexity, a single communication path is preferably provided on main control bus 201 and a method of time-slicing ("windowing") and direct memory access ("dma") are utilized under the control of coordinator 240 for subsystem communication and communication of control information generally. This is however, not to be understood as a limitation of the present invention. The invention is equally applicable to systems utilizing various other bus structures including but not limited to various topologies, busses comprising multiple sub-busses, multiple busses and protocols involving subsystem-directed contention handling, among others.

Referring now to FIG. 4, if a new subsystem transfer (or other communication) is required in step 410, then in step 420, coordinator 240 polls its allocation table for an available time-segment assignment ("channel"), delegates a next available channel for the transfer and logs the allocation in its allocation table. Next in step 430, coordinator 240 sends a corresponding designation to the sending and receiving subsystems. If, in step 410, no new transfer is required or a designation has been sent to the sender and receiver in step 430, then, in step 440, coordinator 240 determines if main control bus 201 is available. If, in step 440, main control bus 201 is available, then, in step 450, coordinator 240 alerts the sending and receiving subsystems and coordinator 240 further enables the transfer. In step 460, the sender subsystem initiates the transfer and the FIG. 4 process ends.

While dynamic allocation might possibly occur more frequently and might therefore be more susceptible to error than static subsystem address assignment, the likelihood of contention is again small. However, it is possible that, for example, a sending subsystem will receive an incorrect assignment, that coordinator 240 will make an incorrect assignment or that the coordinator 240 allocation table will become corrupted and contention will occur. Given the potential for catastrophic failure if a prolonged current surge results from concurrent driving of a bus-line high and low, a detection and handling means is nevertheless prudent.

FIGS. 5 through 8 show how video system 200 (FIG. 2) provides for detection and handling of excess current, most often a result of contention, according to the invention.

Figure 5:
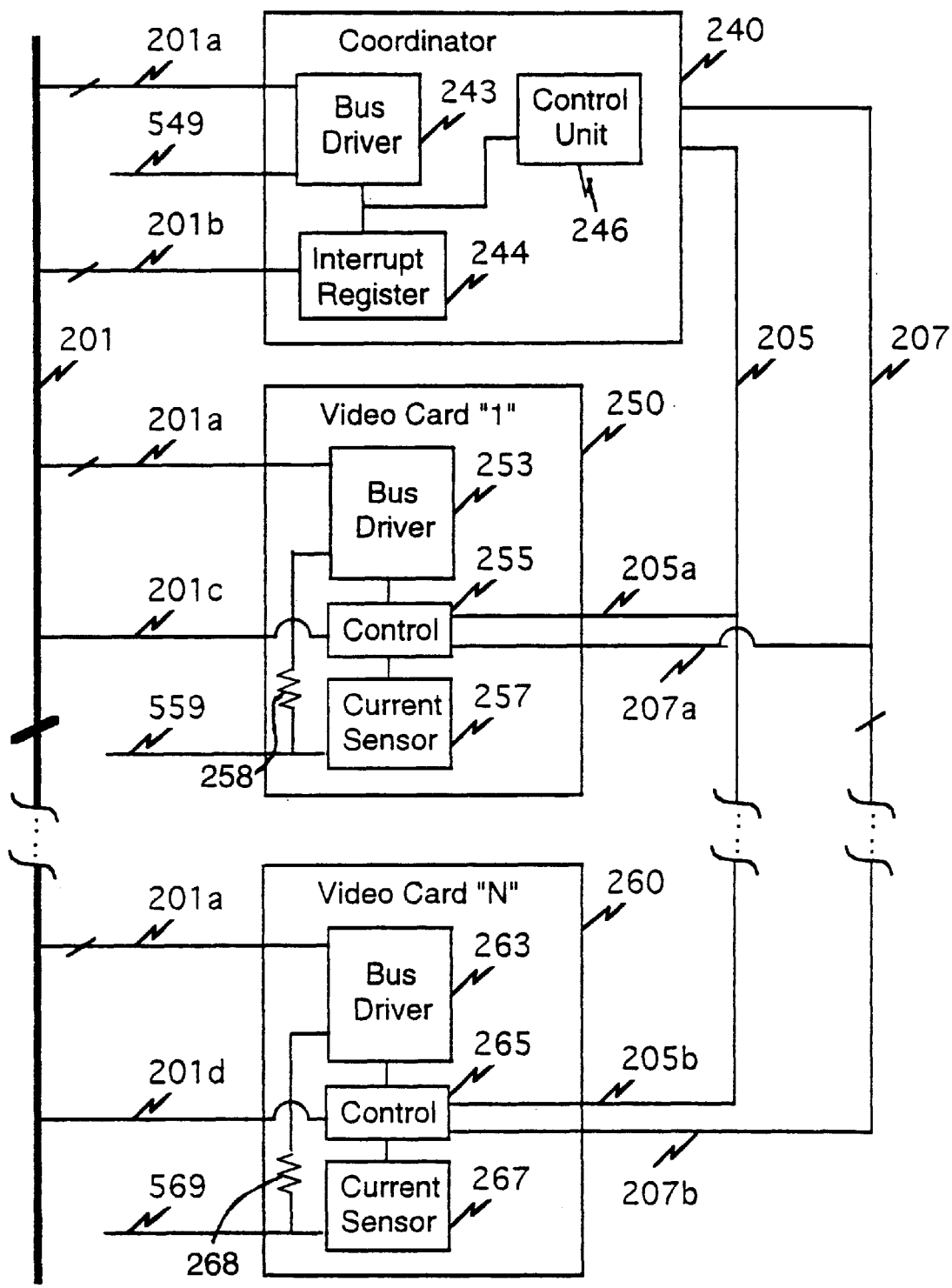
FIG. 5 is a detailed block diagram showing an excessive current detecting, eliminating, reporting and correcting system in accordance with the invention.

The FIG. 5 block diagram illustrates generally how video system 200 is configured to provide for detection and handling of excessive current. As shown, video system 200 comprises elements including coordinator 240, video card-1 250 and video card-N 260, and communication links including main control bus 201, fault line 205 and reset line 207.

Coordinator 240 comprises bus driver 243, interrupt register 244, control unit 246, and communication lines including connection 201a to main control bus 201 multiplexed address and data lines, connection 201b to main control bus 201 interrupt lines, connection 549 to the power supply, connection to fault line 205 and connection to reset lines 207. The power supply and power connections to other coordinator 240 elements are not shown for clarity of illustration.

Video card-1 250 further comprises elements including bus driver 253, control unit 255, current sensor 257 resistor 258, and communication links including connection 201a to main control bus 201 multiplexed address and data lines, connection 201c to main control bus 201 interrupt lines, connection 559 to the power supply, connection 205a to fault line 205 and connection 207a to reset lines 207. The power supply and power connections to other video card-1 250 elements are not shown for clarity of illustration.

Video card-N (as with video card-1 250 and other represented video cards) further comprises elements including bus driver 263, control unit 265, current sensor 267, and communication links including connection 201a to main control bus 201 multiplexed address and data lines, connection 201d to main control bus 201 interrupt lines, connection 569 to the power supply, connection 205b to fault line 205 and connection 207b to reset lines 207. The power supply and power connections to other video card-N 260 elements are not shown for clarity of illustration.

During communication and in the absence of excessive current, bus driver 263 of video card-N 260 drives the preferably multiplexed address and data lines of main control bus 201 at a rate of 20 megaHertz and between a high voltage of 3.0 volts and a low voltage of zero volts utilizing connections 201a and indicating a "one" and "zero" state respectively. Given bus impedance variance, a maximum current required for so driving main control bus 201 is preferably approximately 64 milliamps per bit, which is supplied by a system power supply (not shown) through power supply connection 569. Such rate, voltages and current may vary significantly however, depending upon specific components utilized, as will be understood by those skilled in the art.

Current sensor 267 of video card-N 260 is connected to power supply line 569 through a resistor 268 for monitoring of current input to bus driver 263 during video card-N 260 communication and for alerting video card-N 260 of an excessive input current ("draw") from a power supply by bus driver 263, such excessive draw indicating that bus driver 263 is supplying an excessive current to main control bus 201 address and data lines. The current sensor 267 output is electrically connected to control unit 265 such that, in the event of an excessive current draw by bus driver 263, current sensor 267 alerts control unit 265 by triggering a control unit 265 input. Control unit 265 then disables bus driver 263 (terminating such excessive current) and reports such occurrence to coordinator 240 by triggering connection 201d to main control bus 201 interrupt lines and further triggering connection 205b to fault lines 205.

Figure 6:
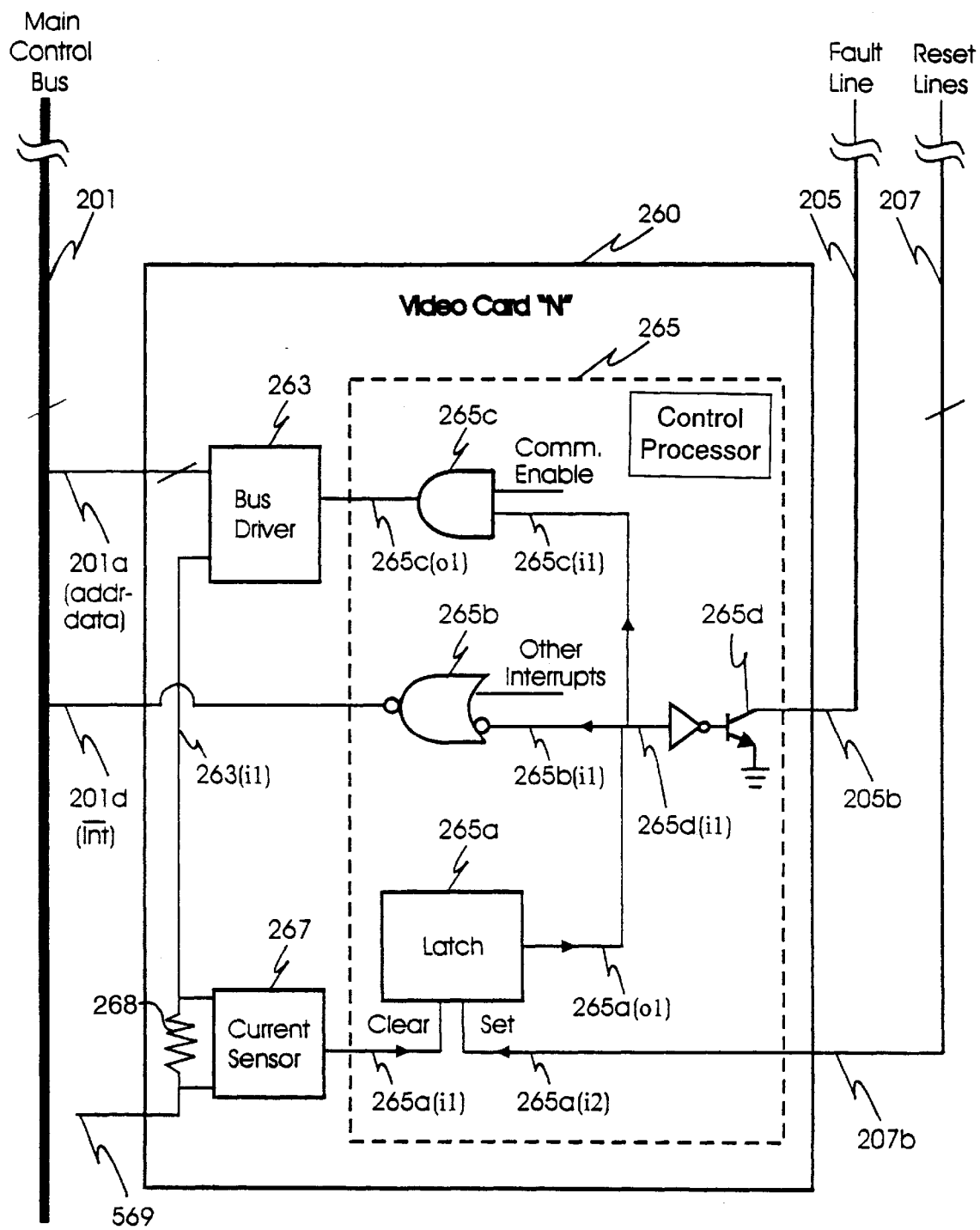
FIG. 6 is a schematic circuit diagram showing an excessive current detection, elimination, reporting and correction circuit according to the invention.

The FIG. 6 schematic diagram shows in greater detail the circuitry and interconnections comprising control unit 265 of video card-N 260 and its connection to other video card-N 260 and video system 200 elements according to a preferred embodiment of the invention. Video card-1 250 and other communicating subsystems are preferably configured in a similar manner for detecting and handling excessive current on main bus 201.

As shown in FIG. 6, control unit 265 preferably comprises latch 265a as well as control logic including gates 265b and 265c, and open-collector transistor 265d. Latch 265a is electrically connected either directly or through control logic to all primary video card-N 260 elements for excessive current detection and handling. Latch 265a is connected by clear-input 265a(i1) to current sensor 267, by set-input 265a(i2) (which is also connection 207b) to reset lines 207. Latch 265a is further connected by output 265a(o1) through gate 265b to main control bus 201 interrupt line connection 201d, through gate 265c to bus driver 263, and through transistor 265d to fault line 205. Thus, control unit 265 operations are effectuated by the setting or clearing of latch 265a.

Latch 265a is ordinarily set during initial setup and address assignment (discussed earlier) by coordinator 240

(FIG. 5) assertion of reset lines 207, which thereby asserts set-input connection 265a(i2). While set (and in the absence of excessive current), latch 265a output connection 265a (o1) remains "high". Thus, gate 265b input connection 2651b(i1) also remains "high", gate 265b is not asserted and no interrupt is generated through connection 201d. In addition, transistor 265d input-connection 265d(i1) remains "high", transistor 265d is not asserted and no fault is generated through connection 205b. Further, gate 265c input-connection 265c(i1) remains "high" and latch 265a therefore does not impede coordinator 240 enabling of bus driver 263 for communication.

Additional connections are provided by gates 265b and 265c. Gate 265b provides an "other interrupts" input such that an interrupt may be generated, in addition to excessive current, upon the occurrence of other conditions. AND-gate 265c further provides a "communications enable" input, such that bus driver 263 is ordinarily enabled only for communication over main control bus 201 according to a schedule controlled by coordinator 240.

Latch 265a is cleared by current sensor 267 detection of excessive current through connection 263(i1) from a power supply, via resistor 268 in which case, current sensor 267 asserts latch 265a clear-input connection 265a(i1). When cleared (due to excessive current detection), latch 265a output connection 265a(o1) is asserted, thereby asserting an interrupt through connection 201d. In addition, clearing latch 265a asserts transistor 265d input-connection 265d(i1), thereby asserting transistor 265d and, through transistor 265 connection to ground, further asserting connection 205b and thus, fault line 205. Clearing latch 265a also asserts AND-gate 265c input-connection 265c(i1), thereby pulling gate 265c output connection 265c(o1) to bus driver 263 "low" and thus disabling bus driver 263.

Other subsystems communicating on main bus 201 under the control of coordinator 240 (FIG. 5) are configured in an equivalent manner with that already described for video card-N 260 for driving main bus 201 and for detecting and handling excessive current. Referring to FIGS. 5 and 6, video card-1 250, for example, comprises similar elements including bus driver 253, control unit 255, current sensor 257, and connections including connection 201a to main control bus 201 address and data lines, connection 201c to main control bus 201 interrupt lines, connection 559 to a power supply (not shown), connection 205a to fault line 205 and connection 207a to reset line 207. Current sensor 257 is connected to power connection 559 through resistor 258 and control unit 255 thereby sensing excessive current draw by bus driver 253 and in such case, triggering control unit 265. Control unit 255, is preferably comprised of a latch and control logic and is connected to a bus driver 253 enable input, through connection 201c to main control bus 201, through connection 205a to fault line 205 and through connection 207a to reset line 207. Control unit 255, upon triggering by current sensor 257, disables bus driver 253 and reports such excessive current condition to coordinator 240 both by asserting interrupt connection 201c and by asserting fault line 205a.

Coordinator 240 (FIG. 5) comprises elements including bus driver 243, interrupt register 248, control unit 245, and connections including connection 201a to main control bus 201 address and data lines, connection 549 to a power supply (not shown), connection 201b to main control bus 201 interrupt lines, connection to fault line 205 and connection to reset lines 207. Coordinator 240 receives reports from a communicating subsystem that has detected and reported such subsystem's drawing of excessive current redundantly through coordinator 240 connection 201b to main control bus 201 interrupt lines and connection to fault line 205. The power supply and power connections to other coordinator 240 elements are not shown for clarity of illustration.

Since an interrupt may be generated for conditions other than excessive current and such reports should not be preempted by prior interrupts, coordinator 240 (FIG. 5) preferably responds to an interrupt first by noting the interrupting subsystem through conventional masking of interrupt register 244. Coordinator 240 then clears interrupt register 244, such that coordinator 240 can receive further interrupts.

In addition, since excessive current is a potentially catastrophic condition which is preferably resolved by the resetting the offending subsystems (which is a serious action possibly resulting in data loss, particularly in a real-time system), coordinator 240 further tests such condition by attempting to reset fault line 205. Coordinator 240 will be unsuccessful at resetting fault line 207 in the event of excessive current since, in such case, fault line 205 is held "low" by transistor 265d (FIG. 6). A catastrophic error (excessive current) is thus confirmed.

Coordinator 240, upon confirming a catastrophic error, asserts reset lines 207 corresponding to the offending subsystems. Referring again to FIG. 6, coordinator 240 asserts a reset line (of reset lines 207) corresponding to video card-N 260, thereby asserting connection 207b (also latch 265a set-connection 265a(i2)) which resets video card-N 260 as described earlier. Coordinator 240 further preferably reports repeated catastrophic error (indicating a non-recoverable system error) to a user through connection to PC 100 (FIG. 2).

Thus, the present invention provides each subsystem capable of communicating over main control bus 201 with means, while communicating over main control bus 201, to quickly and reliably detect excessive current (likely due to contention) that its bus driver might generate over main control bus 201 during such communication, to disable such bus driver and to report such excessive current to coordinator 240. The present invention further provides for testing and confirming that such error exists before preferably resetting the offending subsystems.

Reliable reporting and excessive current detecting-subsystem identification are preferably assured by the redundant use of main control bus 201 interrupt lines and fault line 205. First, fault line 205 is preferably configured as a single-line "wired logical OR" with respect to each subsystem capable of communicating over main control bus 201. Not only is such a configuration, which lacks any unnecessary components, extremely reliable, but any such occurrence of excessive current is consistently reported to coordinator 240 in the same manner (ie. through assertion of fault line 205 by the excessive current-detecting subsystem). Second, use of main control bus 201 interrupt lines provides not only a redundant reporting of conditions warranting coordinator 240 attention, but also the preferred use of multiple interrupt lines connected to coordinator 240 interrupt register 248 provides reliable interrupt register masking means for identifying a reporting subsystem.

Correction is preferably provided by coordinator 240 asserting one or more reset lines 207 which correspond to a reporting and/or potentially to a contending subsystem. Since one possible cause of excessive current is a failed coordinator 240 assignment of a subsystem address during initial reset, and due to the need to quickly and reliably resolve such error in a real time system, a reset of such subsystem is preferred over potential reporting subsystem diagnostics utilizing control unit 245.

Figure 7:
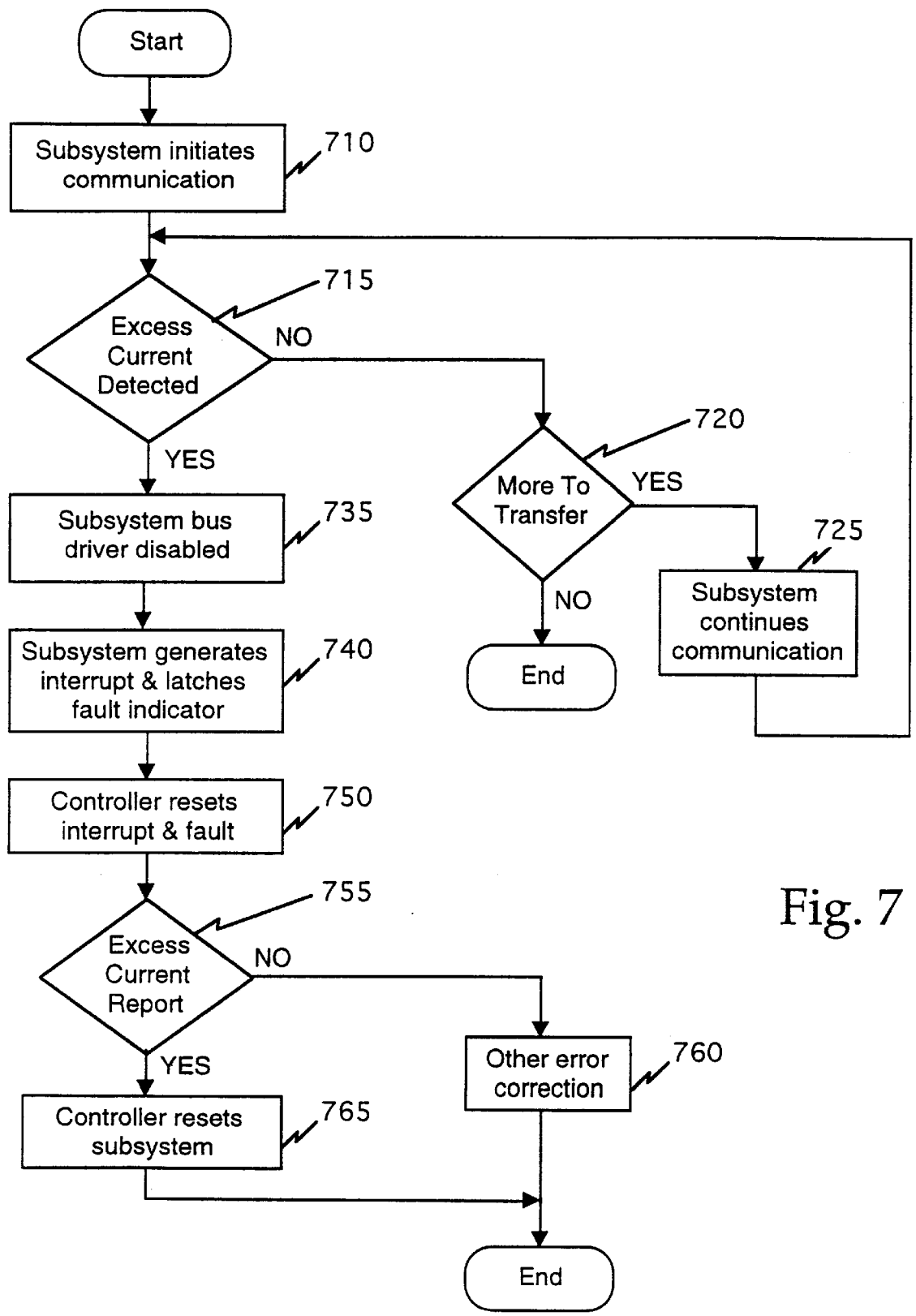
FIG. 7 is a flowchart showing steps utilized to detect, eliminate, report and correct excessive current in accordance with the invention.

The FIG. 7 flowchart illustrates how excessive current is detected, reported and handled according to a preferred embodiment of the present invention. In step 710, a subsystem begins communicating over main control bus 201. If, in step 715, the communicating subsystem does not detect excessive current, then if further, in step 620, more communication is warranted, then, in step 725, the subsystem continues communicating. If however, in step 715, the communicating subsystem detects excessive current, then, in step 735, the subsystem disables its ability to drive the bus, and in step 740, the communicating subsystem asserts an interrupt and latches a fault indicator. Further, in step 750, a system controller, having received an interrupt, initiates a reset of its interrupt register and fault indicator to confirm the critical excessive current error and, in addition, to clear the interrupt register. If, in step 755, such reset is successful and thus excessive current is not reported, then, in step 760, alternative corrective action is taken for the reported non-critical error, otherwise in step 765, excessive current having been reported, the system controller resets the communicating subsystem.

Figure 8:
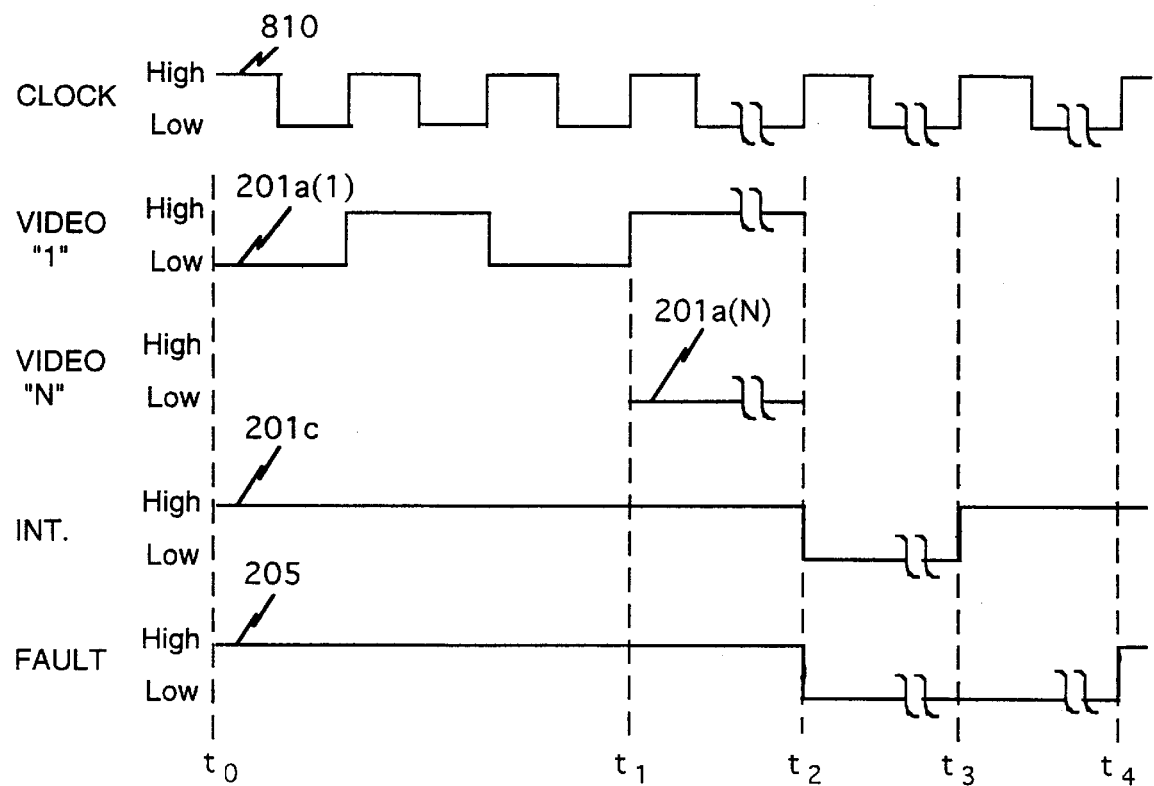
FIG. 8 is a timing diagram showing an example of communication signals resulting from detected excessive current in accordance with the invention.

The FIG. 8 timing diagram (with reference to FIG. 5) shows an example of signals which may be generated as a result of excessive current detection and handling according to the present invention. Indicated are a synchronization clock pulse 810, communicating subsystem (video card-1 250) connection 201a(1) to one of the address and data lines of main control bus 201, contending subsystem (video card-N 260) connection 201a(N) to the same address and data line of main control bus 201, and interrupt line connection 201c to main control bus and fault line 205, respectively, from top to bottom.

At time $t_0$ video card-1 250 initiates communication over main control bus 201, utilizing bus driver 253 to alternatively drive main control bus 201 address and data line, (signal 201a(1)), between "low" and "high" states. At time $t_1$, video card-N 260 initiates communication on the same bus line as the ongoing video card-1 250 communication, whereby video card-1 250, in signal 201a(N), attempts to drive the bus line high while video card-N 260, in signal 201a(1), attempts to drive the bus line low. Prior to time $t_2$ such contention has resulted in an attempt by video card-1 250 to supply sufficient current to drive the bus-line high, such attempt resulting in video card-1 drawing excessive current through connection 559 and further resulting in video card-N sinking excessive current. Also prior to time $t_2$, current sensors 257 and 267 have detected the excessive current. As a result, control unit 255 at time $t_2$, has disabled bus driver 253, thereby ending signal 201a(1). Similarly, control unit 265 has disabled bus driver 263, thereby ending signal 201a(N). Also at time $t_2$, control unit 255 has further triggered interrupt connection 201c and latched fault line connection 205a low, resulting in the "low" states of signals 201c and 205 respectively. Prior to time $t_3$, coordinator 240 has been alerted of an error by signals 201c and 205 and has, at time $t_3$, tested the error by resetting interrupt register 244 and by attempting to reset fault line 205, resulting in signal 201c returning to a "high" state and signal 205 remaining "low". Coordinator 240, having determined that a catastrophic failure exists (ie. excessive current), has, prior to time $t_4$, initiated a reset of video card-1 250 and video card-N by asserting corresponding connections of reset lines 207. Thus at time $t_4$, the video cards have been reset, releasing fault line 205, as given by signal 205.

While the above description contains many specifics, these should not be construed as limitations on the scope of the invention but rather as examples of preferred embodiments thereof. Many other possibilities exist within the spirit and scope of this invention. For example, while video system 200 is useful for illustrative purposes, current detection and handling according to the present invention is also applicable to a variety of other systems and system types in which excessive current in the course of driving a communications connection requires detection and handling. Such systems, for example, may not be connected to a PC, may provide non-real-time operation and/or may utilize various currents, voltages, power supply capabilities and timing.

A second example is that the invention is also applicable to systems employing topologies other than the linear bus model illustrated, as well as systems in which multiple topologies are utilized and/or where no specific topology model predominates. Similarly, the number and types of communications connections may vary substantially from those of the illustrated video system. This includes, for example, the use of multiple busses and/or sub-busses for communication as well as varied error reporting and reset configurations. In addition, the protocol illustrated is only one example of many that might be utilized, including but not limited to contention-based bus acquisition rather than or in addition to the illustrated coordinator-control, windowing and/or dma.

A third example is that subsystem communications enabling and/or fault reporting may utilize various connection configurations and protocols, including but not limited to multiple fault lines and/or microprocessor-based subsystem and/or controller function embodiments.

A fourth example is that various discrete, integrated and/or microprocessor-based control and other element combination, interconnection systems and/or related methods are further anticipated, according to the teachings of the present invention.

A fifth example is that corrective action in response to excessive current, other than resetting related subsystems might be taken. For example, data-loss relating to resetting a subsystem might be minimized by resetting only the improperly communicating subsystem or by merely halting communication by and re-assigning such subsystem. Numerous other examples also exist within the scope and spirit of the present invention.

What is claimed is:

1. A system for detecting and handling excessive current resulting from contending subsystems among a plurality of communicating subsystems utilizing a plurality of communication connections, comprising:

a communications driver integral to each subsystem for providing subsystem communication over said communication connections;

a current sensor device integral to each subsystem for detecting excessive current applied to said communications driver; and a subsystem control device coupled to said current sensor for preventing continued excessive current.

2. The system of claim 1 wherein said subsystem control device is coupled to said communications driver such that said subsystem control device disables said communications driver if said current sensor detects excessive current applied to said communications driver.

3. The system of claim 1 wherein said system is coupled to a host computer for exchanging commands and data with said host computer.

4. A system for detecting and handling excessive current resulting from contending subsystems among a plurality of communicating subsystems utilizing a plurality of communication connections, comprising:

a communications driver integral to each subsystem for providing subsystem communication over said communication connections;

a current sensor device integral to each subsystem for detecting excessive current applied to said communications driver;

a subsystem control device coupled to said current sensor for preventing continued excessive current; and a system coordinator device coupled to said subsystem control devices for directing said subsystem control devices in preventing further excessive current.

5. The system of claim 4 wherein said system coordinator device is coupled to said subsystems and said subsystem control devices such that said system coordinator device resets said subsystem control devices of said contending subsystems.

6. The system of claim 4 further comprising a main control bus, a plurality of fault connections and a plurality of reset lines connecting said system coordinator device to said communicating subsystems, said main control bus including a clock signal, address and data lines and interrupt lines, said system coordinator device including an integral interrupt register coupled to said interrupt lines.

7. The system of claim 6 wherein said interrupt lines, said fault lines and said reset lines connect said system coordinator device to specific said subsystem control devices such that said subsystem control device of said contending subsystem disables said communications driver of said contending subsystem and further alerts said system coordinator device by asserting said interrupt lines and said fault lines.

8. The system of claim 7 wherein said system coordinator device confirms an excessive current condition and then takes further corrective action if alerted by said subsystem control device of said contending subsystem.

9. The system of claim 8 wherein said system coordinator device confirmation includes said system coordinator device attempt to reset said interrupt register and said asserted fault lines, confirmation of excessive current being indicated by an unsuccessful attempt.

10. The system of claim 9 wherein said fault lines comprise a single connection between each subsystem control device and said system coordinator device in a wired-or configuration.

11. The system of claim 8 wherein said system coordinator device further corrective action includes asserting said reset lines corresponding to said contending subsystem, thereby resetting said contending subsystem and said subsystem control device of said contending subsystem.

12. A system for detecting and handling excessive current resulting from contending subsystems among a plurality of communicating subsystems communicating over a plurality of busses, comprising:

a system coordinator device coupled to each of said communicating subsystems;

a current sensor integral to each of said communicating subsystems, each current sensor being coupled to an integral subsystem bus driver such that said current sensor generates a sensor output signal in response to excessive bus driver input current; and a subsystem control device integral to each subsystem, each subsystem control device being coupled to said current sensor, said bus driver and said system coordinator device, such that said subsystem control device disables said bus driver and asserts a plurality of error-reporting connections to said system coordinator device in response to the sensor output signal, each subsystem control device being further coupled to a plurality of reset connections such that said subsystem control device ceases to disable said bus driver and ceases to assert said error-reporting connections in response to assertion of said reset connections by said system coordinator device.

13. The system of claim 12 wherein said subsystem control device comprises discrete components.

14. The system of claim 13 wherein said discrete components include a latch and a plurality of control logic.

15. The system of claim 12 wherein said error-reporting connections comprise a plurality of interrupt lines, each connecting a different communicating subsystem to said system coordinator device, and a single fault line connecting said subsystem control devices of all communicating subsystems utilizing said bus to said system coordinator device utilizing a wired-or fault line configuration.

16. The system of claim 12 wherein said subsystem control device comprises a processor.

17. A method for detecting and handling excessive current resulting from contending subsystems among a plurality of communicating subsystems utilizing a plurality of communication connections, comprising the steps of:

monitoring current being supplied to each of said communicating subsystems;

detecting an occurrence of excessive current being supplied to any of said communicating subsystems;

communicating said occurrence to a subsystem control device integral to said subsystem; and preventing continued excessive current using said subsystem control device.

18. The method of claim 17 wherein the step of monitoring current is accomplished by sensing current being supplied to a communication driver of each of said communicating subsystems and the step of preventing continuing excessive current is accomplished by disabling said communications driver if excessive current is sensed.

19. The method of claim 18 further comprising the step of resetting said subsystem control device.

20. A method for detecting and handling excessive current resulting from contending subsystems among a plurality of communicating subsystems utilizing a plurality of communication connections, comprising the steps of:

monitoring current being supplied to each of said communicating subsystems;

detecting an occurrence of excessive current being supplied to any of said communicating subsystems;

communicating said occurrence to a subsystem control device; and preventing continued excessive current using said subsystem control device, wherein the step of preventing further excessive current is directed by a system coordinator device.

21. A method for detecting and handling excessive current resulting from contending subsystems among a plurality of communicating subsystems utilizing a plurality of communication connections, comprising the steps of:

monitoring current being supplied to each of said communicating subsystems;

detecting an occurrence of excessive current being supplied to any of said communicating subsystems;

communicating said occurrence to a subsystem control device; and preventing continued excessive current using said subsystem control device, wherein the step of communicating is accomplished by asserting an interrupt and plurality of fault lines connecting said contending subsystem to said system coordinator device, thereby communicating an excessive current condition to said system coordinator device.

22. The method of claim 21 further comprising the steps of said system coordinator device polling an integral interrupt register to identify said communicating subsystem having an excessive current condition, said system coordinator device further clearing said interrupt register and reasserting said fault lines to confirm said excessive current condition.

23. The method of claim 22 further comprising the step of said system coordinator device resetting said communicating subsystem and said subsystem control device.

24. An apparatus for detecting and handling excessive current resulting from contending subsystems among a plurality of communicating subsystems utilizing a plurality of communication connections, comprising:

means integral to each subsystem for monitoring current being supplied to each of said communicating subsystems;

means integral to each subsystem for detecting an occurrence of excessive current being supplied to any of said communicating subsystems;

means integral to each subsystem for communicating said occurrence to a subsystem control device; and means integral to each subsystem for preventing continued excessive current using said subsystem control device.

* * * * *